(12) United States Patent
Tsorng et al.

(10) Patent No.: US 11,570,923 B1
(45) Date of Patent: Jan. 31, 2023

(54) BASE AND CLIP ASSEMBLY

(71) Applicant: Quanta Computer Inc., Taoyuan (TW)

(72) Inventors: Yaw-Tzorng Tsorng, Taoyuan (TW);
Wei-Kang Tsai, Taoyuan (TW);
Ming-Lung Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/446,330

(22) Filed: Aug. 30, 2021

(51) Int. Cl.
*H05K 7/14* (2006.01)

(52) U.S. Cl.
CPC ...................... *H05K 7/14* (2013.01)

(58) Field of Classification Search
None
See application file for complete search history.

(56) References Cited

U.S. PATENT DOCUMENTS

| | | | |
|---|---|---|---|
| 5,726,865 A * | 3/1998 | Webb | H05K 7/1405 439/759 |
| 9,689,509 B1 * | 6/2017 | Aliberti | F16L 3/13 |
| 2008/0074850 A1 * | 3/2008 | Kuo | H05K 7/1404 361/740 |
| 2009/0294600 A1 * | 12/2009 | Dodge | F16L 3/12 248/73 |
| 2012/0145837 A1 * | 6/2012 | Li | H02G 3/32 248/74.2 |
| 2012/0145838 A1 * | 6/2012 | Chiu | H02G 3/32 248/74.2 |
| 2018/0087692 A1 * | 3/2018 | Geiger | F16L 3/04 |

* cited by examiner

*Primary Examiner* — James Wu
*Assistant Examiner* — Christopher L Augustin
(74) *Attorney, Agent, or Firm* — Nixon Peabody LLP

(57) ABSTRACT

A clip and base assembly includes at least one polymeric clip and a base. The clip includes first and second elastic arms, and a support arm. The clip forms an aperture therein. The first and second elastic arms move between first and second positions. The first and second elastic arms are located on opposing sides with the support arm in between. The base includes a first and second sets of notches, and an elongated slot. The first set of notches is sized and shaped to receive the first elastic arm. The second set of notches is sized and shaped to receive the second elastic arm. When the first and second elastic arms are in the second position, the clip is moveable in the elongated slot. When the first and second elastic arms are in the first position, the clip is fixed respect to the base.

20 Claims, 7 Drawing Sheets

BASE AND CLIP ASSEMBLY

FIELD OF THE INVENTION

The present disclosure relates generally to a base and clip assembly that assists in managing cables. More particularly, the base and clip assembly assists in managing multiple cables from, for example, devices in a computer system.

BACKGROUND OF THE INVENTION

Computer systems, such as servers, computers, and printers include numerous components contained therein. These components include electrical devices. The electrical devices within these computer systems typically have cables that are connected to, for example, printed circuit boards. These cables can be of similar or differing lengths and/or having similar or differing gaps between connections. These cables are often disorganized. Attempts to organize these cables can lead to inefficient and less than optimal designs, limited flexibility, and/or limited connector locations.

It would be desirable to have an assembly that manages the cables and allows for an optimized design, flexible connector locations and/or ease of operation.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one aspect of the present disclosure, a clip and base assembly configured for managing cables comprises at least one polymeric clip and a base. The at least one polymeric clip includes a first elastic arm, a second elastic arm, and a support arm. The at least one polymeric clip forms an aperture therein. Each of the first and second elastic arms is moveable between a first position and a second position. The first and second elastic arms are located on opposing sides. The support arm is located generally between the first and second elastic arms. The base includes a first set of a plurality of notches, a second set of a plurality of notches, and an elongated slot located between the first set of the plurality of notches and the second set of the plurality of notches. Each of the first set of the plurality of notches is sized and shaped to receive the first elastic arm. Each of the second set of the plurality of notches is sized and shaped to receive the second elastic arm. When the first and second elastic arms are in the second position, the at least one polymeric clip is configured to move in the elongated slot of the base. When the first and second elastic arms are in the first position, the at least one polymeric clip is fixed respect to the base.

According to a configuration of the above implementation, the support arm is in the shape of a general "L" or a general "U" in another embodiment.

According to another configuration of the above implementation, the support arm extends into the aperture.

In a further implementation, the aperture formed in the at least one polymeric clip is in the shape of a general "U."

In yet another implementation, the first and second elastic arms are pivotedly hinged to move between their respective first and second positions.

In one implementation, the at least one polymeric clip is integrally formed into one piece.

In a further implementation, the at least one polymeric clip includes acrylonitrile butadiene styrene (ABS), polycarbonate (PC), or combinations thereof.

In a further aspect of the above implementation, wherein the first set of the plurality of notches includes at least 4 notches, and wherein the second set of the plurality of notches includes at least 4 notches. In another embodiment, the first set of the plurality of notches includes at least 6 notches, and the second set of the plurality of notches includes at least 6 notches. In a further embodiment, the first set of the plurality of notches includes at least 8 notches, and the second set of the plurality of notches includes at least 8 notches.

In yet another implementation, the first set of the plurality of notches and the second set of the plurality of notches are in a general polygonal shape. One non-limiting example of a generally polygonal shape is a rectangular shape.

In one implementation, the base comprises a metallic material. In another embodiment, the base comprises a polymeric material.

In a further implementation, the at least one polymeric clip is a plurality of polymeric clips.

According to another aspect of the present disclosure, a computer system comprises at least one polymeric clip, a base, a printed circuit board and an electrical device. The at least one polymeric clip includes a first elastic arm, a second elastic arm, and a support arm. The at least one polymeric clip forms an aperture therein. Each of the first and second elastic arms is moveable between a first position and a second position. The first and second elastic arms is located on opposing sides. The support arm is located generally between the first and second elastic arms. The base includes a first set of a plurality of notches, a second set of a plurality of notches, and an elongated slot located between the first set of the plurality of notches and the second set of the plurality of notches. Each of the first set of the plurality of notches is sized and shaped to receive the first elastic arm. Each of the second set of the plurality of notches is sized and shaped to receive the second elastic arm. The electrical device includes a cable. The cable extends from the electrical device and loops over the support arm of the at least one polymeric clip before being connected to the printed circuit board. When the first and second elastic arms are in the second position, the at least one polymeric clip is configured to move in the elongated slot of the base. When the first and second elastic arms are in the first position, the at least one polymeric clip is fixed respect to the base.

In a further aspect of the above implementation, the computer system is a server, computer or a printer.

In a further implementation, the electrical device is a fan or a battery module.

In another implementation, the first and second elastic arms are located on opposing sides and the support arm is located generally between the first and second elastic arms.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
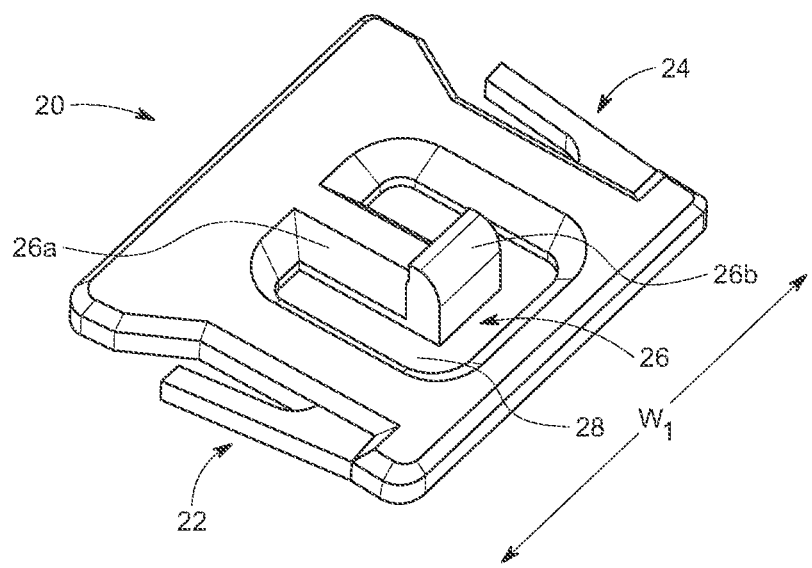
FIG. 1 is a top perspective view of a polymeric clip, according to one embodiment of the present disclosure.

According to one aspect of the present disclosure, a clip and base assembly configured for managing cables comprises at least one polymeric clip and a base. The at least one polymeric clip includes a first elastic arm, a second elastic arm, and a support arm. The at least one polymeric clip forms an aperture therein. Each of the first and second elastic arms is moveable between a first position and a second position. The first and second elastic arms are located on opposing sides. The support arm is located generally between the first and second elastic arms. The base includes a first set of a plurality of notches, a second set of a plurality of notches, and an elongated slot located between the first set of the plurality of notches and the second set of the plurality of notches. Each of the first set of the plurality of notches is sized and shaped to receive the first elastic arm. Each of the second set of the plurality of notches is sized and shaped to receive the second elastic arm. When the first and second elastic arms are in the second position, the at least one polymeric clip is configured to move in the elongated slot of the base. When the first and second elastic arms are in the first position, the at least one polymeric clip is fixed respect to the base.

The clip and base assembly includes at least one polymeric clip and a base. The clip and base assembly is configured to manage cables in computer systems such as servers, computer systems, stand-alone computers, printers, laptops, industrial computers, Chromebooks, and tablets. The cables to be managed by the at least one polymeric clip and base may be associated with various electrical devices in these computer systems such as fans, battery modules, or any devices with fan or cables/power cables.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a top perspective view of a polymeric clip 20 is shown according to one embodiment. The polymeric clip 20 includes a first elastic arm 22, a second elastic arm 24, and a support arm 26. The polymeric clip 20 forms an aperture therein 28. Each of the first and second elastic arms 22, 24 is moveable between a first position and a second position, as will be discussed below with respect to FIG. 6B. The first and second elastic arms 22, 24 of FIG. 1 are pivotedly hinged to move between their respective first and second positions. The first and second elastic arms 22, 24 are located on opposing sides of the polymeric clip 20 as shown in FIG. 1.

The support arm 26 is located generally between the first and second elastic arms 22, 24. The support arm 26 is in the shape of a general "L" as shown in FIG. 1. Specifically, the support arm 26 has a first portion 26a and a second portion 26b. The second portion 26b of the support arm 26 is generally perpendicular to the first portion 26a that is integrally connected. As will be discussed below, the support arm 26 is configured to accept and secure a cable from an electrical device. Referring still to FIG. 1, the support arm 26 extends into the aperture 28 of the polymeric clip 20. The aperture 28 is in the shape of a general "U" and is configured to be sized and shaped to accept a cable therethrough. It is contemplated that the aperture formed in the polymeric clip may be in other shapes and sizes to accept a cable therethrough.

The polymeric clip 20 of FIG. 1 is integrally formed into one piece. It is desirable for the polymeric clip 20 to be integrally formed into one piece for easier manufacturing and cost reduction. The polymeric clip 20 includes acrylonitrile butadiene styrene (ABS), polycarbonate (PC), or combinations thereof. It is contemplated that other polymeric materials may be used to form the polymeric clip.

It is contemplated that the polymeric clip may be formed in multiple pieces in another embodiment. For example, in one embodiment, the first and second elastic arms may comprise an elastic material such as acrylonitrile butadiene styrene (ABS), polycarbonate (PC), or combinations thereof. The remaining portion of the polymeric clip may comprise a rigid plastic material.

Figure 2:
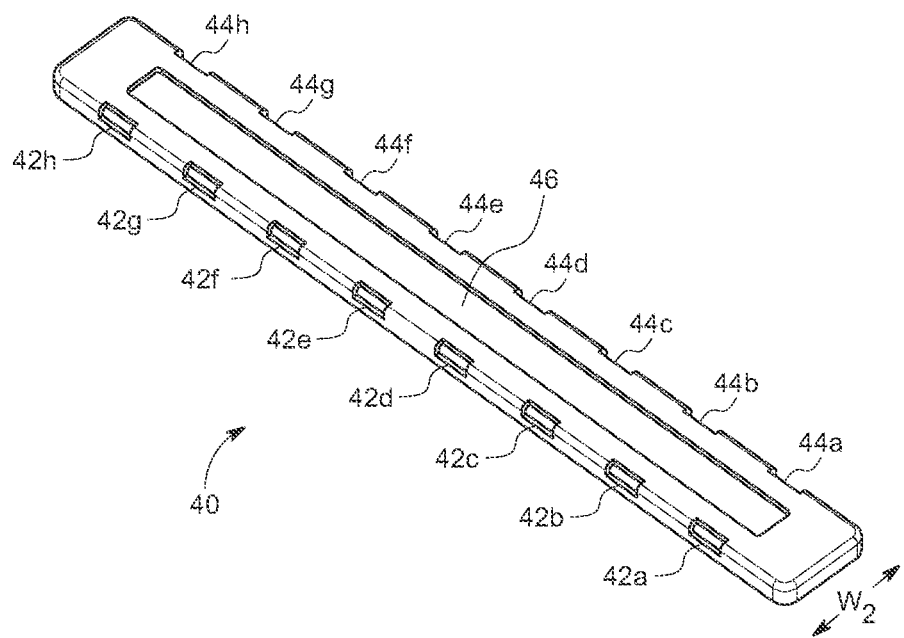
FIG. 2 is a top perspective view of a base, according to one embodiment of the present disclosure.

Referring to FIG. 2, a top perspective view of a base 40 is shown according to one embodiment. The base 40 includes a first set of a plurality of notches 42a-42h, a second set of a plurality of notches 44a-44h, and an elongated slot 46 located between the first set of the plurality of notches 42a-42h and the second set of the plurality of notches 44a-44h. Each of the first set of the plurality of notches 42a-42h is sized and shaped to receive the first elastic arm 22 of the polymeric clip 20. Each of the second set of the plurality of notches 44a-44h is sized and shaped to receive the second elastic arm 24 of the polymeric clip 20.

The elongated slot 46 is sized and shaped to enable the support arm 26 to extend therethrough. Referring to FIGS. 1 and 2, interior width W2 (see FIG. 2) of the base 40 is greater than a width W1 of the polymeric clip 20 (see FIG. 1). This enables the polymeric clip to be installed into the base as will be discussed below.

The first set of the plurality of notches 42a-42h and the second set of the plurality of notches 44a-44h both include at least 8 notches as shown in FIG. 2. It is contemplated that the first and second sets of the plurality of notches may vary in the number of notches. In another embodiment, the first and second sets of the plurality of notches both include at least 4 notches. In a further embodiment, the first and second sets of the plurality of notches both include at least 6 notches.

Referring still to FIG. 2, the first set of the plurality of notches 42a-42h and the second set of the plurality of notches 44a-44h are in a general polygonal shape. More specifically, the first set of the plurality of notches 42a-42h and the second set of the plurality of notches 44a-44h are in a general rectangular shape.

Referring still to FIG. 2, the first set of the plurality of notches 42a-44h and the second set of the plurality of notches 44a-44h are in a general polygonal shape. More specifically, the first set of the plurality of notches 42a-44h and the second set of the plurality of notches 44a-44h are in a general rectangular shape.

In one embodiment, the base comprises a metallic material. Non-limiting examples of metallic material that may form the base include aluminum or an aluminum alloy (e.g., ADC10 or ADC12). It is desirable for the metallic material, if used, to be made of a lighter metal.

In another embodiment, the base comprises a polymeric material. Non-limiting examples of polymeric material that may form the base include polystyrene (e.g., toughened polystyrene (TPS), high impact polystyrene (HIPS)), polycarbonate (PC), or combinations thereof.

Figure 3A:
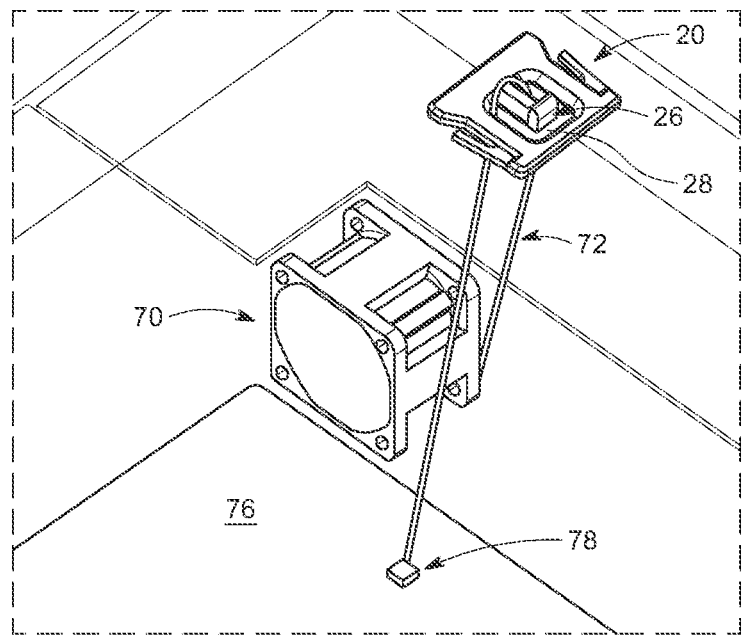
FIG. 3A is a top perspective view of the polymeric clip of FIG. 1 and an electrical device including a cable according to one installation process.

Referring to FIGS. 3A-5, a sequence of steps for installing a cable management clip and base assembly 10 (see FIG. 4A) is shown according to one method. Referring initially to FIGS. 3A, 3B, an electronic device 70, a printed circuit board (PCB) 76, and the polymeric clip 20 are depicted. The electronic device 70 includes a cable 72 extending therefrom. The cable 72 extends from the electronic device 70 and loops over the support arm 26 (shown best in FIG. 3B) before being connected to the printed circuit board 76 via a connector 78. The cable 72 is looped by initially entering the aperture 28 near section 30 as shown in FIG. 3B. The cable 72 is then moved over the support arm 26 (specifically over the second portion 26b) to eventually contact a top surface of the first portion 26a of the support arm 26.

In one embodiment, the electronic device 70 is a fan such as shown in FIG. 3A. In another embodiment, the electronic device is a battery module. It is contemplated that the electronic device may be other devices with a cable.

Figure 3B:
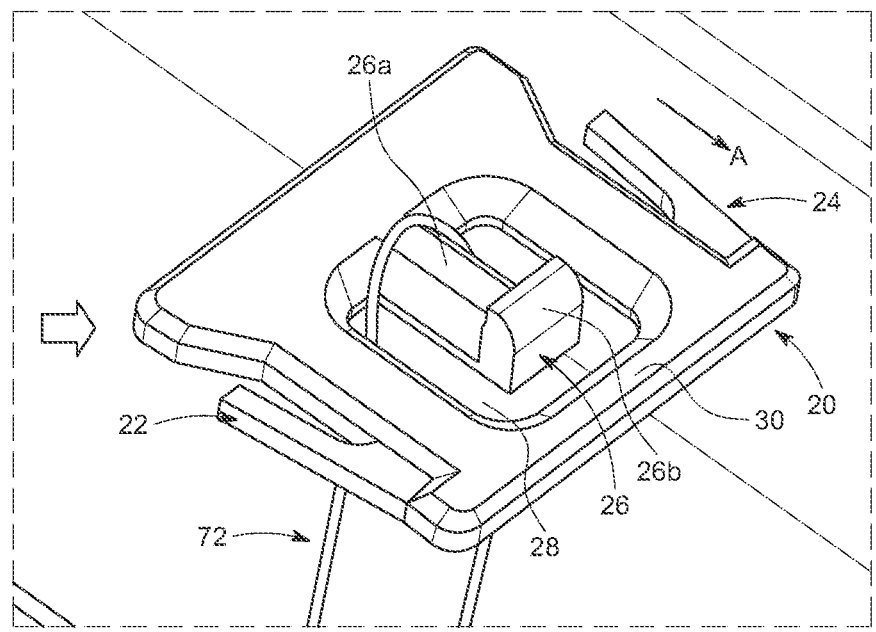
FIG. 3B is an enlarged top perspective view of the polymeric clip and the cable of FIG. 3A.

The second portion 26b of the support arm 26 assists in limiting the lateral movement of the cable 72 in the direction of arrow A in FIG. 3B after being looped over. By limiting the movement in the lateral direction of arrow A, the general positioning of the cable 72 is desirably maintained on the top surface of the first portion 26a of the polymeric clip 20.

Figure 4A:
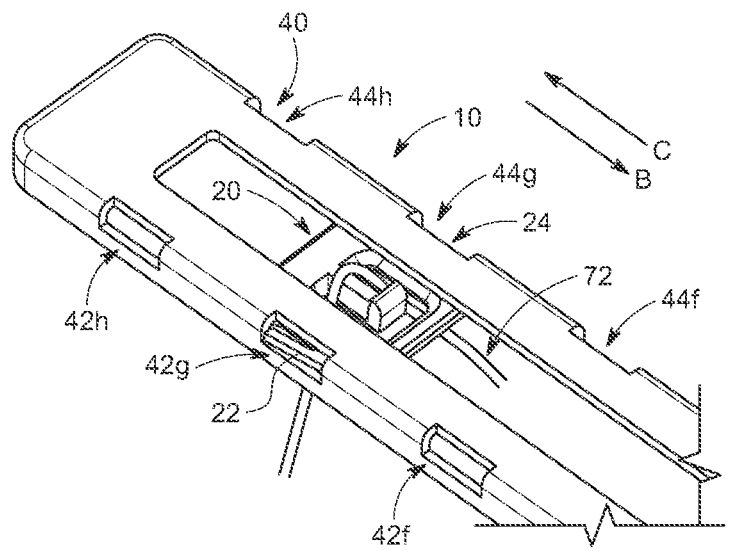
FIG. 4A is a top perspective view of the polymeric clip of FIG. 1, a portion of the base of FIG. 2, and the cable of FIG. 3A, according to one installation process.

Referring to FIG. 4A, the clip and base assembly 10 is shown using the polymeric clip 20 and the base 40. The first elastic arm 22 extends through the notch 42g. The second elastic arm 24 extends through the notch 44g on the opposite side. When the first and second elastic arms 22, 24 are in the positions shown in FIG. 4A (first positions), the polymeric clip 20 is in a fixed or locked position with respect to the base 40. In the first position, the polymeric clip 20 does not move in the directions of arrows B and C.

Figure 4B:
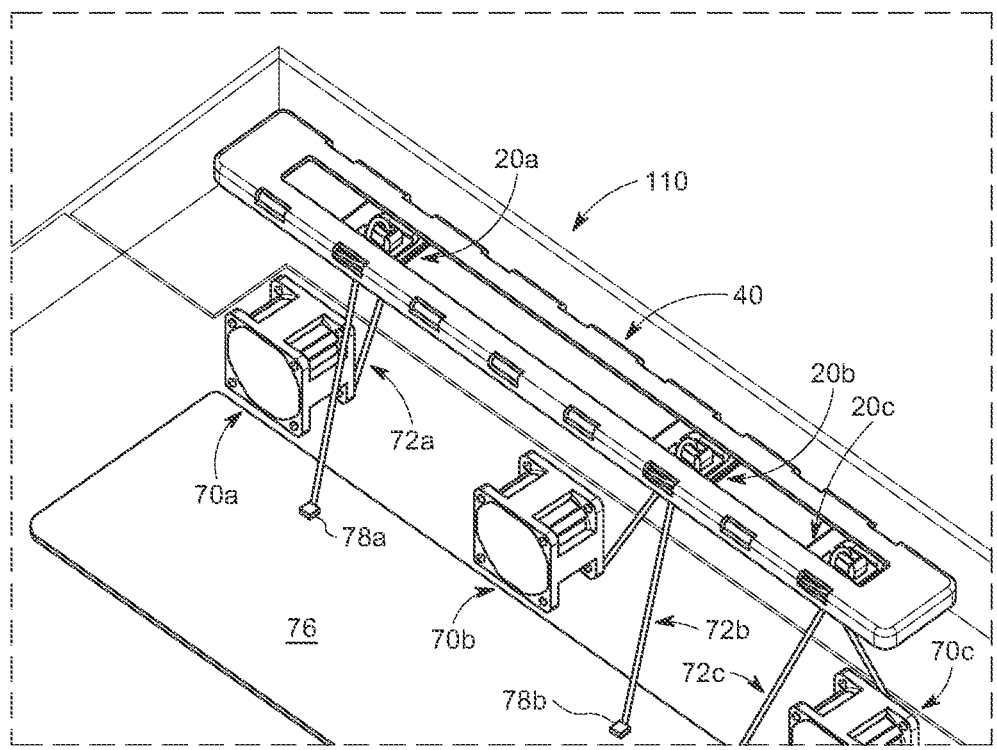
FIG. 4B is a top perspective view of the polymeric clips from FIG. 1, the base of FIG. 2, and the electrical devices and the cables from FIG. 3A, according to one installation process.

Referring to FIG. 4B, a clip and base assembly 110 is shown using a plurality of polymeric clips 20a-20c and the base 40. FIG. 4B also depicts a plurality of electronic devices 70a-70c. Each of the plurality of electronic devices 70a-70c includes a respective cable 72a-72c. Each of the respective cables 72a-72c is connected to the printed circuit board 76 via a respective connector (only connectors 78a, 78b are shown). FIG. 4B does not depict the base 40 being secured to the computer system.

Figure 5:
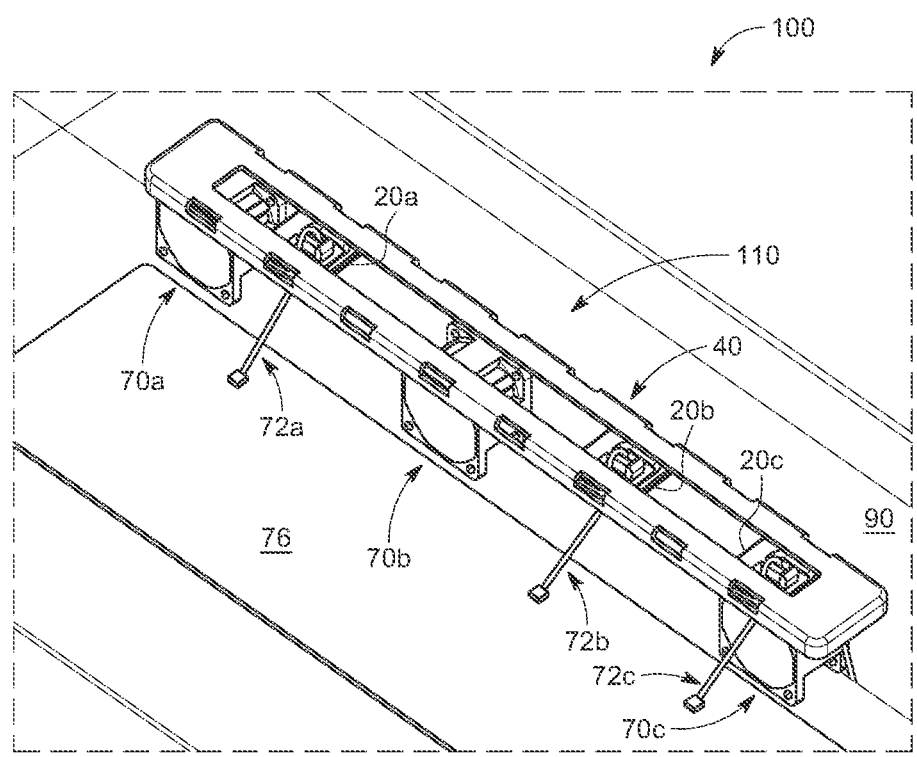
FIG. 5 is a top perspective view of the polymeric clips of FIG. 4B, the base of FIG. 2, and the electrical devices and the cables of FIG. 4B after the base has been installed.

Referring to FIG. 5, the base 40 is shown secured to a wall 90 of a computer system 100 (partially shown). Non-limiting examples of a computer system include servers, computers systems, stand-alone computers, printers, laptops, industrial computers, Chromebooks, and tablets. The base 40 may be attached to the computer system 100 by a variety of methods. In one method, the base is fastened to the computer system by, for example, screws. In another method, the base is welded to the computer system. It is contemplated that other methods may be used to attach the base to the computer system.

It is contemplated that the sequence for steps installing the polymeric clips 20a-20c and the base 40, and securing the cables 72a-72c, may be performed in a different sequence than described with respect to FIGS. 3A-5. For example, an operator may be assembled sequentially if a number of clips need to be installed. The fan location is followed to install the clips into the base to assist in preventing or inhibiting disorganization.

Figure 6A:
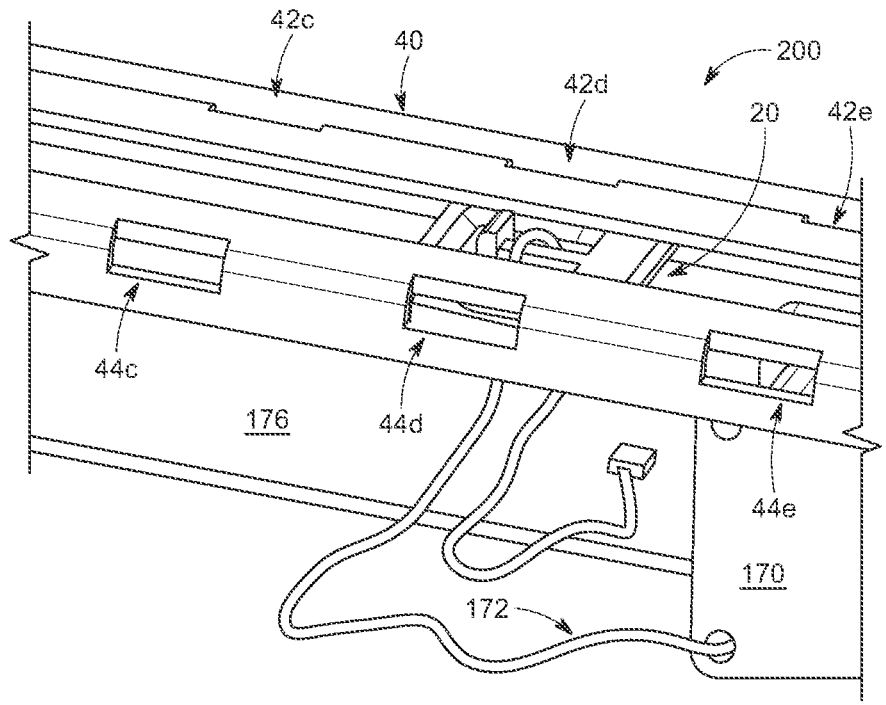
FIG. 6A is a side perspective view of the polymeric clip of FIG. 1, the base of FIG. 2, and a device and a cable, according to one embodiment of the present disclosure.
Figure 6B:
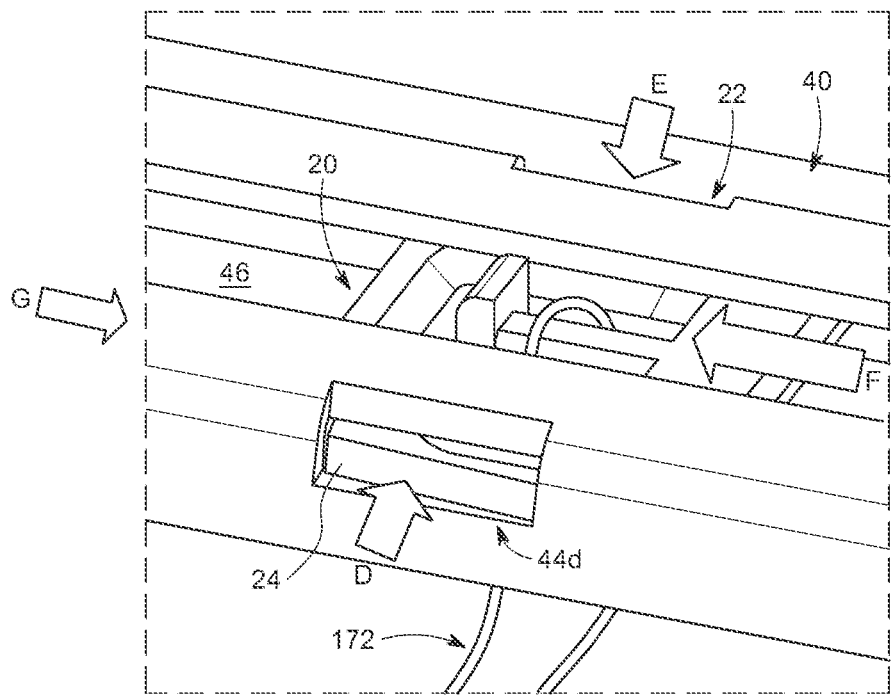
FIG. 6B is a side perspective view of the polymeric clip of FIG. 6A, the base of FIG. 6A, and the cable of FIG. 6A illustrating how the polymeric clip is moved with respect to the base.
Figure 6C:
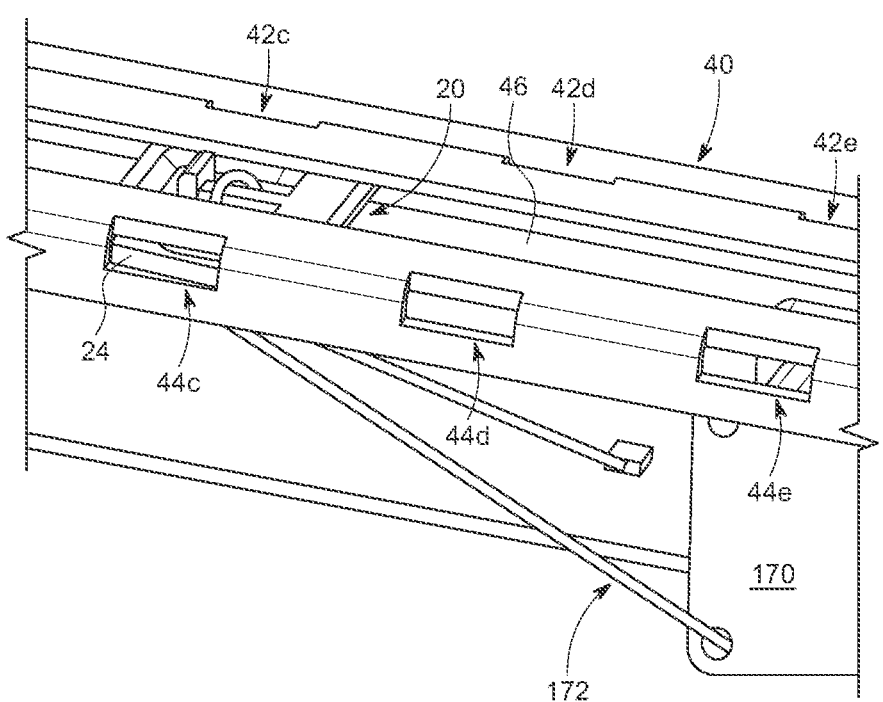
FIG. 6C is a side perspective view of the polymeric clip of FIG. 6A, the base of FIG. 6A, and the device and the cable of FIG. 6A in which the cable has been tightened.

FIGS. 6A-6C illustrate the process of moving a polymeric clip 20 with respect to the base 40. Thus, the polymeric clip 20 is adjustable with respect to the base 40. By moving the polymeric clip 20, the length of the cable (e.g., cable 172) can be adjusted. FIG. 6A shows the base 40 after it has already been installed. A computer system 200 includes the polymeric clip 20, the base 40, an electronic device 170 including the cable 172, and a printed circuit board 176. The cable 172 in FIG. 6A is in a loose and dangled position. To tighten the cable 172, the polymeric clip 20 must be moved in a direction away from the electronic device 170.

Referring to FIG. 6B, each of the first and second elastic arms 22, 24 is moved or pressed inwardly (see arrows D, E). After the first and second elastic arms 22, 24 are moved or pressed inwardly (see arrows D, E), the polymeric clip 20 can be slid or moved in the direction of Arrow F in the elongated slot 46 of the base 40. It is noted that the polymeric clip 20 is also capable of being slid in the opposite direction (Arrow G) in the elongated slot 46 of the base 40. After the polymeric clip 20 is slid in the direction of Arrow F, the position of the polymeric clip 20 is shown in FIG. 6C. Thus the polymeric clip 20 moves from the notches 42d, 44d (FIG. 6B) to the notches 42c, 44c (FIG. 6C). The polymeric clip 20 of FIG. 6C is secured or locked in notches 42c, 44c. The cable 172 in FIG. 6C is in a tightened position.

The above process of adjusting the cable length is a simple and efficient process for an operator. The assembly is advantageous because it can be used with: (1) the same or different cable lengths; or (2) with the same or different gaps between the connector.

Figure 7:
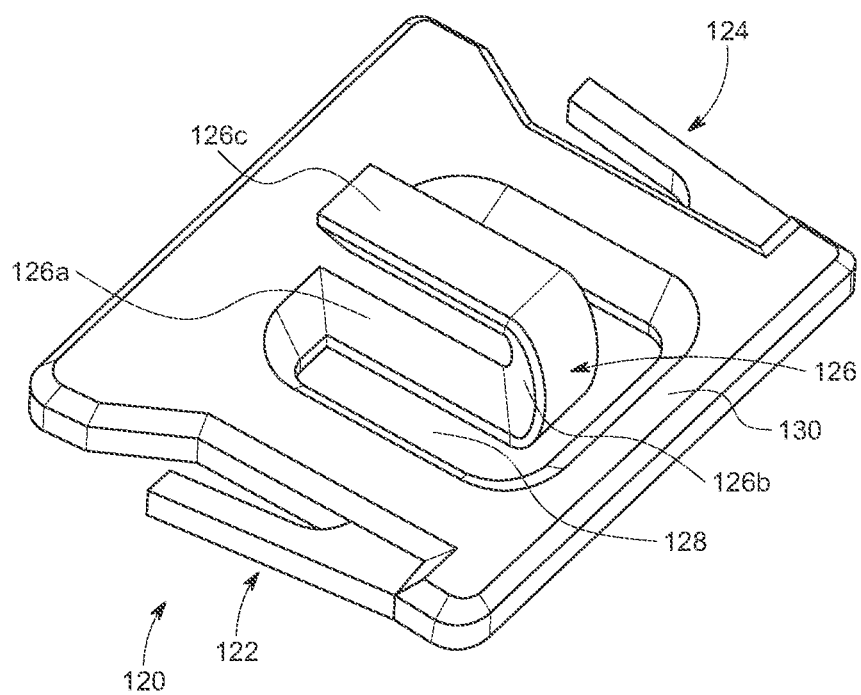
FIG. 7 is a top perspective view of a polymeric clip, according to another embodiment of the present disclosure.

It is contemplated that the polymeric clip may be sized and shaped in a different manner than the polymeric clip of FIG. 1. In one example, the support arm 26 of FIG. 1 is modified to a different shape. Referring to FIG. 7, a top perspective view of a polymeric clip 120 is shown according to another embodiment. The polymeric clip 120 includes a first elastic arm 122, a second elastic arm 124, and a support arm 126. The polymeric clip 120 forms an aperture therein 128. The first and second elastic arms 122, 124 function the same as the first and second elastic arms 22, 24 described above. The first and second elastic arms 122, 124 are located on opposing sides of the polymeric clip 120.

The support arm 126 is located generally between the first and second elastic arms 122, 124. The support arm 126 is in the shape of a general "U" as shown in FIG. 7. Specifically, the support arm 126 has a first portion 126a, a second portion 126b, and a third portion 126c. The support arm 126 functions in a similar manner as the support arm 26. A cable is extended through the aperture 128 near section 130 and then is looped over the support arm 126 into a space between the first portion 126a and the third portion 126c.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A clip and base assembly configured for managing cables, the assembly comprising:
at least one polymeric clip including a first elastic arm, a second elastic arm, and a support arm, the at least one polymeric clip forming an aperture therein, each of the first and second elastic arms moveable between a first position and a second position, the first and second elastic arms located on opposing sides, the support arm located generally between the first and second elastic arms; and
a base including a first set of a plurality of notches, a second set of a plurality of notches, and an elongated slot located between the first set of the plurality of notches and the second set of the plurality of notches, each of the first set of the plurality of notches sized and shaped to receive the first elastic arm, each of the second set of the plurality of notches sized and shaped to receive the second elastic arm,
wherein when the first and second elastic arms are in the second position, the at least one polymeric clip is configured to move in the elongated slot of the base,
wherein when the first and second elastic arms are in the first position, the at least one polymeric clip is fixed respect to the base.

2. The clip and base assembly of claim 1, wherein the support arm is in the shape of a general "L".

3. The clip and base assembly of claim 1, wherein the support arm is in the shape of a general "U".

4. The clip and base assembly of claim 1, wherein the support arm extends into the aperture.

5. The clip and base assembly of claim 1, wherein the aperture formed in the at least one polymeric clip is in the shape of a general "U".

6. The clip and base assembly of claim 1, wherein the first and second elastic arms are pivotedly hinged to move between their respective first and second positions.

7. The clip and base assembly of claim 1, wherein the at least one polymeric clip is integrally formed into one piece.

8. The clip and base assembly of claim 1, wherein the at least one polymeric clip includes acrylonitrile butadiene styrene (ABS), polycarbonate (PC) or the combination thereof.

9. The clip and base assembly of claim 1, wherein the first set of the plurality of notches includes at least 4 notches, and wherein the second set of the plurality of notches includes at least 4 notches.

10. The clip and base assembly of claim 9, wherein the first set of the plurality of notches includes at least 6 notches, and wherein the second set of the plurality of notches includes at least 6 notches.

11. The clip and base assembly of claim 10, wherein the first set of the plurality of notches includes at least 8 notches, and wherein the second set of the plurality of notches includes at least 8 notches.

12. The clip and base assembly of claim 1, wherein the first set of the plurality of notches and the second set of the plurality of notches are in a general polygonal shape.

13. The clip and base assembly of claim 12, wherein the first set of the plurality of notches and the second set of the plurality of notches are in a general rectangular shape.

14. The clip and base assembly of claim 1, wherein the base comprises a metallic material.

15. The clip and base assembly of claim 1, wherein the base comprises a polymeric material.

16. The clip and base assembly of claim 1, wherein the at least one polymeric clip is a plurality of polymeric clips.

17. A computer system comprising:
at least one polymeric clip including a first elastic arm, a second elastic arm, and a support arm, the at least one polymeric clip forming an aperture therein, each of the first and second elastic arms moveable between a first position and a second position, the first and second elastic arms located on opposing sides, the support arm located generally between the first and second elastic arms;
a base including a first set of a plurality of notches, a second set of a plurality of notches, and an elongated slot located between the first set of the plurality of notches and the second set of the plurality of notches, each of the first set of the plurality of notches sized and shaped to receive the first elastic arm, each of the second set of the plurality of notches sized and shaped to receive the second elastic arm;
a printed circuit board; and
an electrical device including a cable, the cable extending from the electrical device and looping over the support arm of the at least one polymeric clip before being connected to the printed circuit board,
wherein when the first and second elastic arms are in the second position, the at least one polymeric clip is configured to move in the elongated slot of the base,
wherein when the first and second elastic arms are in the first position, the at least one polymeric clip is fixed respect to the base.

18. The computer system of claim 17, wherein the computer system is a server, computer or a printer.

19. The computer system of claim 17, wherein the electrical device is a fan or a battery module.

20. The computer system of claim 17, wherein the first and second elastic arms are located on opposing sides, the support arm located generally between the first and second elastic arms.

* * * * *